(12) United States Patent
Frye et al.

(10) Patent No.: US 9,870,438 B2
(45) Date of Patent: Jan. 16, 2018

(54) COMPUTERIZED METHOD FOR PRODUCING A PRODUCTION PLANT MODEL

(71) Applicant: BAYER AKTIENGESELLSCHAFT, Leverkusen (DE)

(72) Inventors: Lars Frye, Leichlingen (DE); Dietmar Günther, Hückeswagen (DE); Nicolai Krasberg, Langenfeld (DE)

(73) Assignees: BAYER TECHNOLOGY SERVICES GMBH, Leverkusen (DE); BAYER AKTIENGESELLSCHAFT, Leverkusen (DE)

( * ) Notice: Subject to any disclaimer, the term of this patent is extended or adjusted under 35 U.S.C. 154(b) by 396 days.

(21) Appl. No.: 14/653,913

(22) PCT Filed: Dec. 18, 2013

(86) PCT No.: PCT/EP2013/077050
§ 371 (c)(1),
(2) Date: Jun. 19, 2015

(87) PCT Pub. No.: WO2014/095972
PCT Pub. Date: Jun. 26, 2014

(65) Prior Publication Data
US 2015/0347636 A1 Dec. 3, 2015

(30) Foreign Application Priority Data
Dec. 20, 2012 (DE) .......................... 10 2012 112 775

(51) Int. Cl.
*G06F 17/50* (2006.01)
*B01J 19/00* (2006.01)
*G05B 19/418* (2006.01)

(52) U.S. Cl.
CPC .......... *G06F 17/5004* (2013.01); *B01J 19/00* (2013.01); *G05B 19/41885* (2013.01);
(Continued)

(58) Field of Classification Search
USPC ............... 703/2; 700/245; 348/36; 358/1.15; 345/440; 382/128
See application file for complete search history.

(56) References Cited

U.S. PATENT DOCUMENTS 6,470,301 B1  10/2002  Barral
7,386,154 B2 *  6/2008  Cosmi ................... G06T 7/0012
                                                    382/128
(Continued)

FOREIGN PATENT DOCUMENTS

DE    21 2009 000 008 U1    10/2010

OTHER PUBLICATIONS

Erdwiens et al.; "Fundamentals for computer-aided layout planning"; Chem. Ing. Tech. 67 (1995) No. 7, p. 853-861—English translation provided.
(Continued)

*Primary Examiner* — Thai Phan
(74) *Attorney, Agent, or Firm* — McBee Moore Woodward & Vanik IP, LLC (57) ABSTRACT

The invention concerns a computerized method for producing a two-dimensional plant model of a modular production plant for producing a chemical product, the production plant comprising at least two processing modules, which can be connected to one another for production purposes, and at least one processing container in which the processing modules can be accommodated at least partially, as required, wherein, for each processing container, a common two-dimensional container model (2) of its the base area (3) and of the base area (3) of a container environment at least partially surrounding the processing container and of predefinable size being generated, wherein, for each processing
(Continued)

module, a two-dimensional module model (5) of its base area is generated, wherein the container model (2) and the module model (5) are divided into fields (1, 4) which are of equal size and preferably square, there being assigned to each field (4) of a module model (5) a module property concerning the occupancy of the particular field (4) by a functional device, of the particular processing module, disposed above the base area portion, of the particular processing module, corresponding to this field (4), by an operations room which is disposed above the base area portion, of the particular processing module, corresponding to this field (4) and assigned to the processing module, or by a material outlet of the processing module which is disposed above the base area portion, of the particular processing module, corresponding to this field (4), there being assigned to each field (1) of the container model (2) an occupancy property concerning the (im)possibility of the particular field (1) being occupied by a module property, the module model (5) being disposed in the container model (2) taking account of the module properties and occupancy properties.

18 Claims, 5 Drawing Sheets (52) U.S. Cl.
CPC .................. *B01J 2219/0002* (2013.01); *B01J 2219/00243* (2013.01); *G05B 2219/32085* (2013.01); *Y02P 90/24* (2015.11); *Y02P 90/26* (2015.11)

(56) References Cited

U.S. PATENT DOCUMENTS

| | | | |
|---|---|---|---|
| 9,441,936 B2* | 9/2016 | Pinkston | G01B 21/00 |
| 2003/0069668 A1* | 4/2003 | Zurn | E01C 19/006 700/245 |
| 2010/0047557 A1* | 2/2010 | Baumann | B22F 7/062 428/325 |
| 2011/0163462 A1 | 7/2011 | Lang et al. | |
| 2011/0227926 A1* | 9/2011 | Tjhi | G06Q 10/06 345/440 |
| 2012/0019612 A1* | 1/2012 | Choudury | H04N 13/0011 348/36 |
| 2015/0227820 A1* | 8/2015 | Dupre | G06K 15/005 358/1.15 |

OTHER PUBLICATIONS

Ritthoff et al.; "Feature-based learning of placement rules as part of the layout planning for chemical plants"; University of Dortmund, Series Computational Intelligence Collaborative Research Center 531; Technical Report, Sep. 2004—English translation provided.
International Search Report from corresponding application PCT/EP2013/077050 dated Apr. 16, 2014.

* cited by examiner

COMPUTERIZED METHOD FOR PRODUCING A PRODUCTION PLANT MODEL

This application is a 371 application of PCT/EP2013/077050 filed Dec. 18, 2013, which claims foreign priority benefit under 35 U.S.C. § 119 of German Application No. DE 10 2012 112 775.1 filed Dec. 20, 2012.

The work which led to this invention was sponsored by grant agreement no. 228867 as part of the European Union's seventh framework program RP7/2007-2013.

The present invention relates to a computerized method for producing a two-dimensional plant model of a modular production plant for producing a chemical product.

In order to produce a particular chemical product, it is necessary to provide a production plant having an individual plant structure in order to be able to carry out the process steps respectively required in terms of process engineering in individual process sections. If there is no longer a desire to produce this particular product, the production plant is usually dismantled again in order to be able to construct another production plant having an individual plant structure, which can be used to produce another chemical product, at the same location. This construction and dismantling of production plants is very time-consuming and cost-intensive. There is therefore a constant need to reduce the amount of effort associated with the production of different chemical products.

The object of the invention is to provide a novel plant concept which can be used to considerably reduce the amount of effort associated with the production of different chemical products in comparison with the conventional procedure.

This object is achieved by a production plant having the features of patent claim 1. Preferred refinements are stated in the subclaims which may each constitute an aspect of the invention per se or in any desired combination with one another.

Patent claim 1 proposes a computerized method for producing a two-dimensional plant model of a modular production plant for producing a chemical product, wherein the production plant has at least two process modules, which can be connected to one another for production purposes, and at least one process container in which the process modules can be at least partially accommodated as intended, wherein, for each process container, a common two-dimensional container model of its base area and of the base area of a container environment at least partially surrounding the process container and of a predefinable size is generated, wherein, for each process module, a two-dimensional module model of its base area is generated, wherein the container model and the module models are divided into grid fields which are of the same size and are preferably square, wherein each grid field of a module model is assigned a module property concerning the occupancy of the respective grid field by a functional device of the respective process module, which functional device is arranged above that section of the base area of the respective process module which corresponds to this grid field, by an operations room which is allocated to the process module and is arranged above that section of the base area of the respective process module which corresponds to this grid field, or by a material output of the process module, which output is arranged above that section of the base area of the respective process module which corresponds to this grid field, wherein each grid field of the container model is assigned an occupancy property concerning the possibility or impossibility of the respective grid field being occupied by a module property, wherein the module models are arranged in the container model taking into account the module properties and the occupancy properties.

The production plant may also have two or more process containers which can be connected to one another for production purposes. The process containers are preferably units which can be transported as a whole, can be transported to a desired production site at which an accordingly equipped production plant is intended to be erected, and can be transported away from this site after the desired production has been concluded. This makes it possible to easily reuse individual process containers at different production sites in a manner that reduces production costs. For this purpose, a process container may have a housing which enables simple transport of the process container and in which process modules suitable for carrying out an entire process or a particular process section are arranged and connected to one another for production purposes. A process container may have, for example, functionalities for heating, cooling, mixing, separating, controlling the pressure, ventilating and/or venting which make it possible to carry out a chemical reaction and control reaction conditions. A process container may also be set up to independently carry out an entire process or a particular process section of production. In this case, independently means that the process section is carried out using the process container without the process section or a part of the latter having to be controlled and/or regulated by a device remote from the process container.

At a production site, at least one process container can be connected, preferably via standardized couplings, to a permanently installed communication network and/or to a supply network which can be used to supply the process container with material and/or energy and/or into which materials can be delivered, with the result that at least one chemical batch reaction and/or continuous production can be carried out in a substantially autonomous manner using the process container. For example, the supply network may have a compressed air line for supplying compressed air, a feed water line for supplying water, an electrical line for supplying electrical energy, a materials line for supplying starting materials and/or auxiliary materials and/or for discharging products, byproducts and/or waste materials, a cooling line for supplying cold or for dissipating heat and/or a heating line for supplying heat or for removing cold. Various wired or wireless communication networks come into consideration as the communication network. Standardized information interchange between the process containers connected to the communication network and/or with superordinate or subordinate devices can be carried out via the communication network.

The process modules which can be connected to one another for production purposes can be at least partially arranged in a process container as intended. In the production plant according to the invention, the entire arrangement of individual process modules for each process container is minimized in terms of its spatial space requirement and the material needed to arrange it as intended, with the result that, in particular, a maximum number of process modules can be arranged in a process container, thus increasing the variability with which a process container is fitted with process modules. The same consequently applies to the variability of the processes or process sections which can be carried out using a process container.

The container model and the module models are divided into grid fields of the same size. The grid fields are preferably square. Alternatively, the grid fields may be circular. Furthermore, a rectangular or elliptical configuration of the grid fields is possible, but the ability to arrange the process modules relative to the process container is restricted as a result in comparison with a square or circular configuration of the grid fields. In principle, other polygonal or oval grid fields which are congruent with respect to one another can also be used.

The module properties and the occupancy properties are boundary conditions with respect to the arrangement of the individual process modules relative to one another and relative to the process container. In the production plant, parts of the process modules are therefore optimally assigned to those sections of the base area of the container and its environment of a predefinable size which correspond to the grid fields of the container model.

Equipment for heating, cooling, mixing, separating, controlling the pressure, ventilating and/or venting or a material input comes into consideration as the functional device, for example. Furthermore, a functional device can be a material and/or energy store which can be connected to a local supply network.

The occupancy properties of the container model are preferably selected from a group comprising at least the properties "cannot be occupied", "can be occupied only by an operations room", "can be occupied only by a functional device", "preferably not occupied", "preferably occupied by an operations room" and "preferably occupied by a functional device".

According to one advantageous refinement, each grid field of the container model is assigned one of the properties "inside the container" or "outside the container". This constitutes a further criterion when arranging the process modules relative to the process container. If a grid field of the container model has the property "inside the container", this grid field is completely inside the base area of the actual process container. In contrast, if a grid field of the container module has the property "outside the container", this grid field is completely outside the base area of the actual process container but completely inside the base area of the actual environment of a limited, predefinable size. Grid fields of a process module which are assigned a functional device of the respective process module are preferably arranged in grid fields of the container model which have the property "inside the container".

According to another advantageous refinement, each grid field of the container model is assigned an absolute integer coordinate pair ($x_{abs}$, $y_{abs}$), wherein the origin of the underlying absolute coordinate system is arranged inside the base area of the process container. This makes it possible to easily individualize the grid fields of the container model, which simplifies the assignment of properties to the individual grid fields of the container model.

Each grid field of a module model is advantageously assigned an integer relative coordinate pair ($x_{rel}$, $y_{rel}$), wherein the origin of the underlying relative coordinate system is arranged inside the base area of the process module. This also makes it possible to easily individualize the grid fields of a module model, which simplifies the assignment of properties to the individual grid fields of the respective module model.

It is also considered to be advantageous if each module model is assigned a position in the absolute coordinate system, which position is defined by the position of the origin of the respective relative coordinate system inside the absolute coordinate system. The ability to arrange a module model relative to the container model constitutes a first degree of freedom of the arrangement of the process modules relative to the process container, which arrangement is to be optimized.

Each module model is preferably assigned an orientation relative to the absolute coordinate system. If the container model and the module models are subdivided into square grid fields, for example, a module model can be oriented at the relative angles 0°, 90°, 180° or 270° relative to the absolute coordinate system. This relative orientability between module models and container model constitutes a second degree of freedom of the arrangement of the process modules relative to the process container, which arrangement is to be optimized.

According to another advantageous refinement, all possible connection variants between grid fields of different module models, which are each assigned a functional device, are determined, wherein each connection variant is weighted with a value from a predefinable range of values, in particular from the range of values $\{-100, \ldots, 100\}$. The connection variants are determined, for example, taking into account material and technical connections or relationships between the individual process modules to be arranged relative to a process container. Material relationships may result from given material streams and waste streams. Technical relationships may be due to distance requirements between devices of process modules, which devices are not compatible with one another.

Connection variants weighted with a negative value preferably result in the distance between grid fields associated with these connection variants being maximized, and connection variants weighted with a positive value result in the distance between grid fields associated with these connection variants being minimized. The distance may be maximized, for example, between technical devices which are not compatible with one another. Minimization of the distance may be used, for example, to reduce the length of pipelines between technical devices of process modules.

It is also considered to be advantageous if, in the case of a plurality of connection variants with comparable weightings with positive values, that connection variant which is weighted with the smallest positive value is selected.

According to another advantageous refinement, the module models are also arranged in the container model taking into account at least one of the further conditions selected from the following group:

a grid field of a module model assigned a functional device of the respective process module must not occupy a grid field of the container model which has already been occupied by a grid field of a further module model assigned a functional device of the respective further process module;

a grid field of a module model assigned an operations room allocated to the respective process module must not occupy a grid field of the container model which has already been occupied by a grid field of a further module model assigned a functional device of the respective further process module;

a grid field of a module model assigned a functional device of the respective process module must not occupy a grid field of the container model assigned the occupancy property "cannot be occupied" or "can be occupied only by an operations room";

a grid field of a module model assigned an operations room allocated to the respective process module must not occupy a grid field of the container model assigned the occupancy property "cannot be occupied" or "can be occupied only by a functional device".

The module models are preferably arranged in the container model taking into account all of these further conditions.

According to another advantageous refinement, the module models are also arranged in the container model taking into account at least one of the further conditions selected from the following group:

a grid field of a module model assigned an operations room allocated to the respective process module should be arranged in a grid field of the container model which has already been occupied by a grid field of a further module model assigned an operations room allocated to the respective further process module;

a grid field of a module model assigned a functional device of the respective process module should be arranged in a grid field of the container model assigned the occupancy property "can be occupied only by a functional device" or "preferably occupied by a functional device";

a grid field of a module model assigned an operations room allocated to the respective process module should be arranged in a grid field of the container model assigned the occupancy property "can be occupied only by an operations room" or "preferably occupied by an operations room";

a grid field of a module model assigned a functional device of the respective process module should be arranged in a grid field of the container model which has already been occupied by a grid field of a further module model assigned a material output of the respective further process module;

a grid field of a module model assigned a material output of the respective process module should be arranged in a grid field of the container model which has already been occupied by a grid field of a further module model assigned a functional device of the respective further process module.

The module models are preferably also arranged in the container model taking into account all of these further conditions.

According to another advantageous refinement, the module models are also arranged in the container model taking into account at least one of the further conditions selected from the following group:

the process modules should be able to be introduced into the process container via a longitudinal side of the latter;

operations rooms and maintenance rooms for the process modules should be accessible after the process modules have been arranged as intended;

the process modules should be able to be individually removed from the process container and installed in the latter without other process modules having to be removed for this purpose;

process streams between process modules arranged as intended should not intersect third process modules.

It is also considered to be advantageous if the module models are arranged in the container model assigned to the process container taking into account the arrangement of module models in a further container model assigned to a further process container, wherein the further process container is arranged above, below or beside the process container. This refinement substantiates further boundary conditions for arranging process modules relative to a process container. In particular, the entire arrangement of process modules in a production plant comprising at least two process containers can be accordingly optimized.

Another advantageous refinement provides for a square standardized transport container, in particular according to DIN ISO 668, to be used as the process container. This makes it possible to easily transport process containers fitted with process modules to the respective production sites using conventional standardized transport means.

It is also proposed that the container model, the module models and the respective relative positions between the module models and the container model are displayed by a display device. This enables a simple control possibility for persons dealing with the planning of a corresponding production plant.

In summary, a method for optimizing an arrangement of at least two process modules of a modular production plant in a process container is therefore provided, wherein the module properties, occupancy properties and conditions mentioned above can be used in different combinations with one another for this optimization. One aim of this optimization is to provide an arrangement of process modules which is as space-saving as possible, in which case optimization functions are preferably formulated and used for this purpose. If an accordingly optimized arrangement of process modules does not comply with a predefinable maximum number of the conditions mentioned above, the optimized arrangement is provided with a corresponding quality value in order to be able to compare different arrangements with one another after corresponding optimizations, for example.

The invention is explained by way of example below with reference to the attached figures using a preferred exemplary embodiment, in which case the features described below may constitute an aspect of the invention both per se and in combination with one another. In the figures

Figure 1:
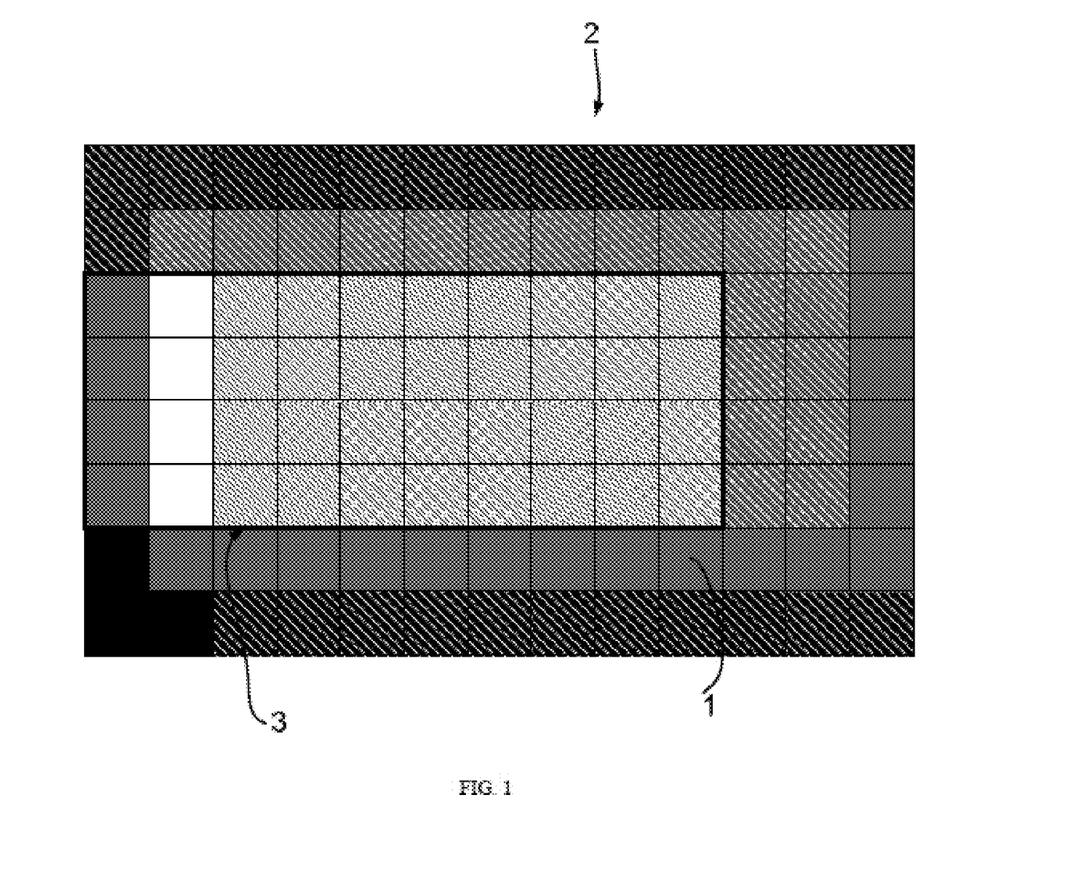
FIG. 1: shows an illustration of an exemplary embodiment for the occupancy of the grid fields of a container model by occupancy properties.

FIG. 1 shows an illustration of an exemplary embodiment for the occupancy of the grid fields 1 of a two-dimensional container model 2 by occupancy properties. The container model 2 was generated for the base area 3 (illustrated in a framed manner) of a process container (not illustrated in any more detail) and the base area 4 of a container environment which partially surrounds the process container and has a predefinable size. The container model 2 has been divided into square grid fields 1 of the same size. The base area 3 of the process container comprises 4×10 grid fields 1. The occupancy properties are selected from a group comprising the properties "cannot be occupied" (black), "can be occupied only by an operations room" (gray), "can be occupied only by a functional device" (white), "preferably not occupied" (black with hatching), "preferably occupied by an operations room" (gray with hatching) and "preferably occupied by a functional device" (white with hatching). As can be seen, functional devices of process modules are preferably arranged inside the process container, whereas operations rooms assigned to process modules may also be arranged outside the process container.

Figure 2:
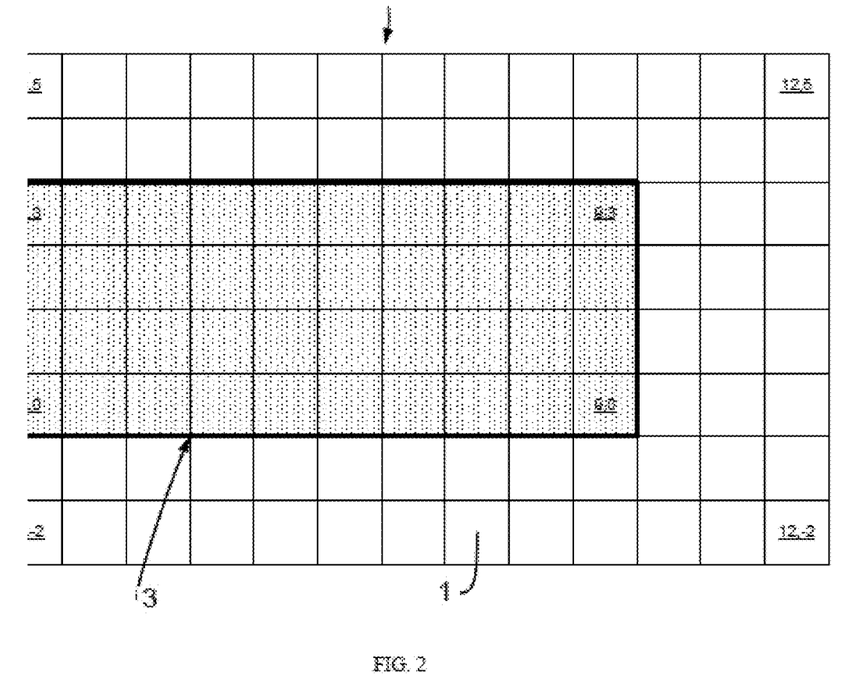
FIG. 2: shows an illustration of the assignment of the container model shown in FIG. 1 using absolute coordinate pairs.

FIG. 2 shows an illustration of the assignment of the container model 2 shown in FIG. 1 using absolute coordinate pairs ($x_{abs}$, $y_{abs}$). The origin of the underlying absolute coordinate system is arranged inside the base area 3 of the process container and is marked using the absolute coordinate pair (0, 0). Each grid field 1 of the container model 2 is also assigned one of the properties "inside the container" (with hatching) or "outside the container" (white).

Figure 3:
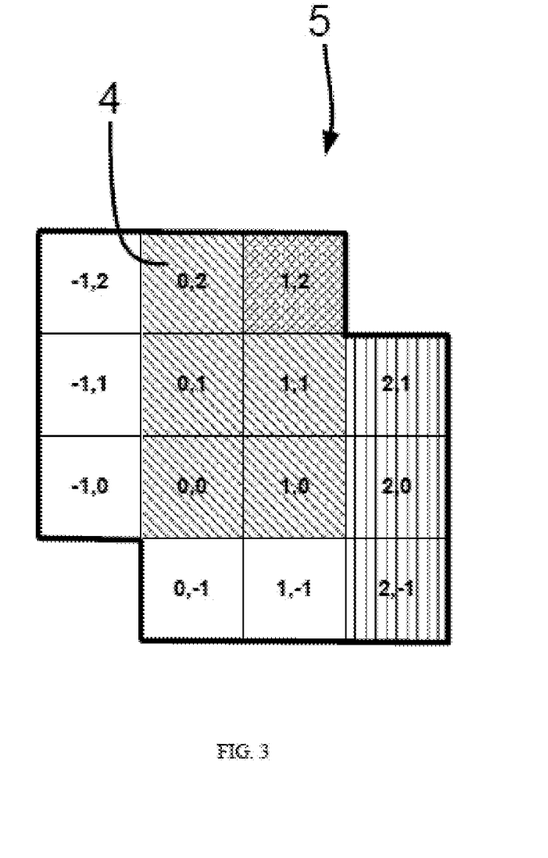
FIG. 3: shows an illustration of an exemplary embodiment for the occupancy of the grid fields of a module model by module properties.

FIG. 3 shows an illustration of an exemplary embodiment for the occupancy of the grid fields 4 of a module model 5, produced for the base area of a process module (not illustrated in any more detail), by module properties. The module model 5 divided into square grid fields 4 of the same size, wherein the dimensioning of the grid fields 4 of the module model 5 corresponds to that of the grid fields 1 of the container model 2 shown in FIGS. 1 and 2. Each grid field 4 of the module model 5 is assigned a relative coordinate pair ($x_{rel}$, $y_{rel}$), wherein the origin of the underlying relative coordinate system is arranged inside the base area of the process module and is marked with the relative coordinate pair (0, 0). Each grid field 4 of the module model 5 is assigned a module property concerning the occupancy of the respective grid field 4 by a functional device of the respective process module, which functional device is arranged above that section of the base area of the respective process module which corresponds to this grid field 4, or by an operations room which is allocated to the process module and is arranged above that section of the base area of the respective process module which corresponds to this grid field 4. The module properties concerning the occupancy of the respective grid field 4 by a functional device of the respective process module, which functional device is arranged above that section of the base area of the respective process module which corresponds to this grid field 4, are selected from a group which the functional properties "material input" (relative coordinate pair (1, 2)) and "process assembly" (relative coordinate pairs (0, 2), (0, 1), (1, 1), (0, 0) and (1, 0)). The module property "process equipment" can be additionally assigned to the grid field 4 having the relative coordinate pair (1, 2). The grid fields 4 having the relative coordinate pairs (−1, 2), (−1, 1), (−1, 0), (0, −1) and (1, −1) are accordingly occupied by the module property "operations room". The grid fields 4 having the relative coordinate pairs (2, 1), (2, 0) and (2, −1) are occupied by the module property "material output".

Figure 4:
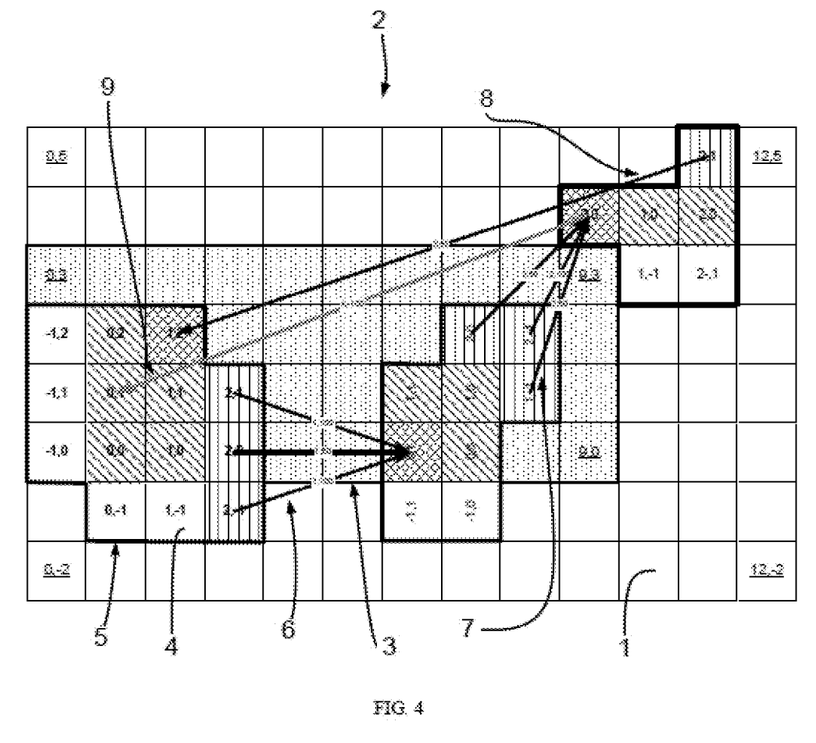
FIG. 4: shows an illustration of the container model with three module models arranged therein.

FIG. 4 shows an illustration of the container model 2 with three module models 5 arranged therein. Each module model 5 is assigned a position in the absolute coordinate system, which position is defined by the position of the origin of the respective relative coordinate system inside the absolute coordinate system. The process module 5 illustrated on the left has, for example, that position in the absolute coordinate system which is marked by the absolute coordinate pair (1, 0). Furthermore, each module model 5 is assigned an orientation relative to the absolute coordinate system. Since the container model 2 and the module models 5 are subdivided into square grid fields 1 and 4, respectively, a module model 5 can be oriented at the relative angles 0°, 90°, 180° or 270° relative to the absolute coordinate system. The process module 5 illustrated on the left is oriented at the relative angle 0° relative to the absolute coordinate system. The middle process module 5 is arranged at the position having the absolute coordinate pair (7, 0) and is oriented at the relative angle 270° relative to the absolute coordinate system. The process module 5 illustrated on the right is arranged at the position having the absolute coordinate pair (9, 4) and is oriented at the relative angle 0° relative to the absolute coordinate system.

In this state of the optimization process, all possible connection variants between grid fields 4 of different module models 5, which are each assigned a functional device, are determined, wherein each connection variant is weighted with a value from a predefinable range of values, in particular from the range of values {−100, . . . , 100}. For example, those grid fields 4 of the module model 5 illustrated on the left which are occupied by the property "material output" can be connected to that grid field 4 of the module model 5 illustrated in the middle which is occupied by the property "material input". These material connections between the module model 5 illustrated on the left and the module model 5 illustrated in the middle are marked with numeral 1 in FIG. 4. These connection variants are indicated by arrows 6 in FIG. 4. The connection variant, according to which the grid field 4 having the relative coordinate pairs (2, 0) of the module model 5 illustrated on the left is connected to the grid field 4 having the relative coordinate pairs (0, 1) of the module model 5 illustrated in the middle, is weighted with the value 50. The two other connection variants indicated by an arrow 6 are each weighted with the value 100.

Corresponding connection variants between grid fields 4 of the module model 5 illustrated in the middle which are occupied by the property "material output" and that grid field of the module model 5 illustrated on the right which is occupied by the module property "material input" are marked with numeral 2 in FIG. 4 and are indicated by arrows 7. The connection variant, according to which the grid field 4 having the relative coordinate pairs (2, −1) of the module model 5 illustrated in the middle is connected to the grid field 4 having the relative coordinate pairs (0, 0) of the module model 5 illustrated on the right, is weighted with the value 100. The other connection variant indicated by an arrow 7 is weighted with the value 50.

A connection variant between the grid fields 4 of the module model 5 illustrated on the left which are occupied by the property "material output" and that grid field of the module model 5 illustrated on the right which is occupied by the module property "material input" is marked with numeral 3 in FIG. 4 and is indicated by the arrow 8. This connection variant, according to which the grid field 4 having the relative coordinate pairs (1, 2) of the module model 5 illustrated on the left is connected to the grid field 4 having the relative coordinate pairs (0, 0) of the module model 5 illustrated on the right, is weighted with the value 50.

A connection variant between the grid fields 4 of the module model 5 illustrated on the left which are occupied by the property "process equipment" and that grid field of the module model 5 illustrated on the right which is occupied by the module property "material input" is marked with numeral 4 in FIG. 4 and is indicated by the arrow 9. This connection variant, according to which the grid field 4 having the relative coordinate pairs (0, 1) of the module model 5 illustrated on the left is connected to the grid field 4 having the relative coordinate pairs (0, 0) of the module model 5 illustrated on the right, is weighted with the value −100. This connection variant therefore relates to a repelling relationship between the module model illustrated on the left and the module model illustrated on the right.

Further connection variants are likewise determined and weighted accordingly. For reasons of clarity, however, further connection variants are not illustrated in FIG. 4.

Connection variants which, like the variant mentioned last, are weighted with a negative value result in the distance between grid fields 4 associated with these connection variants being maximized, and connection variants which, like the other connection variants mentioned above, are weighted with a positive value result in the distance between grid fields associated with these connection variants being minimized. In the case of a plurality of connection variants with comparable weightings with positive values, as is the case for the connection variants marked with numerals 1 and 2, for example, that connection variant which is weighted with the smallest positive value is preferably selected.

Figure 5:
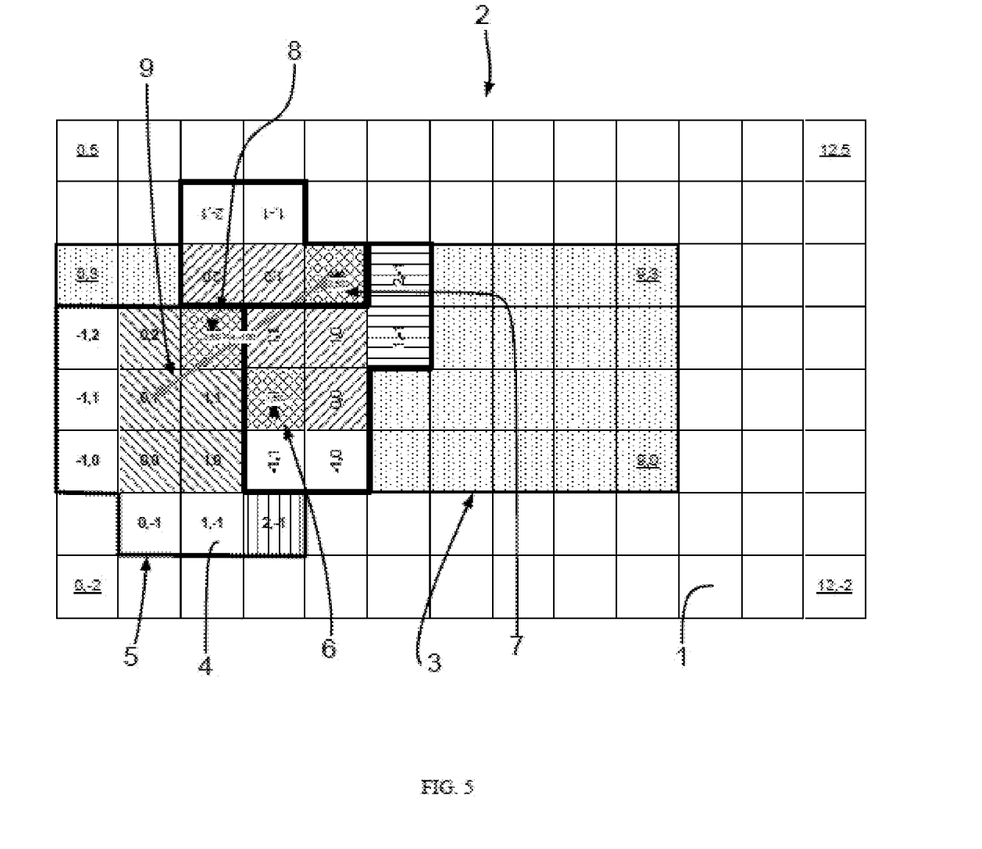
FIG. 5: shows an illustration of the container model shown in FIG. 4 after optimization of the arrangement of the three module models relative to one another and relative to the container model.

FIG. 5 shows an illustration of the container model 2 shown in FIG. 4 after optimization of the arrangement of the three module models 5 relative to one another and relative to the container model 2. As can be seen, those grid fields 4 of the module models 5 which are assigned a functional device of the respective process module are all situated inside the base area 3 of the process container (not illustrated in any more detail). Each module model 5 is assigned an optimized position in the absolute coordinate system, which position is defined by the position of the origin of the respective relative coordinate system inside the absolute coordinate system. The optimized position of the process module 5 illustrated on the left corresponds to the starting position of this module model 5, as shown in FIG. 4, before the optimization is carried out. The middle process module 5 is arranged at the optimized position having the absolute coordinate pair (4, 1) and is oriented at the relative angle 270° relative to the absolute coordinate system. The process module 5 illustrated on the right is arranged at the optimized position having the absolute coordinate pair (4, 3) and is oriented at the relative angle 180° relative to the absolute coordinate system. This optimized arrangement of the module models 5 in the container model 2 is displayed by a display device (not illustrated in any more detail).

The invention claimed is:

1. A computerized method for producing a two-dimensional plant model of a modular production plant for producing a chemical product, wherein the production plant has at least two process modules, which can be connected to one another for production purposes, and at least one process container in which the process modules can be at least partially accommodated as intended, wherein, for each process container, a common two-dimensional container model of its base area and of the base area of a container environment at least partially surrounding the process container and of a predefinable size is generated, wherein, for each process module, a two-dimensional module model of its base area is generated, wherein the container model and the module models are divided into grid fields which are of the same size, wherein each grid field of a module model is assigned a module property concerning the occupancy of the respective grid field by a functional device of the respective process module, which functional device is arranged above that section of the base area of the respective process module which corresponds to this grid field, by an operations room which is allocated to the process module and is arranged above that section of the base area of the respective process module which corresponds to this grid field, or by a material output of the process module, which output is arranged above that section of the base area of the respective process module which corresponds to this grid field, wherein each grid field of the container model is assigned an occupancy property concerning the possibility or impossibility of the respective grid field being occupied by a module property, wherein the module models are arranged in the container model taking into account the module properties and the occupancy properties.

2. The computerized method according to claim 1, wherein the occupancy properties are selected from a group comprising at least one of the following properties: cannot be occupied, can be occupied only by an operations room, can be occupied only by a functional device, not occupied, occupied by an operations room and occupied by a functional device.

3. The computerized method according to claim 2, wherein the module models are arranged in the container model taking into account at least one of the further conditions selected from the following group:

a grid field of a module model assigned an operations room allocated to the respective process module should be arranged in a grid field of the container model which has already been occupied by a grid field of a further module model assigned an operations room allocated to the respective further process module;

a grid field of a module model assigned a functional device of the respective process module should be arranged in a grid field of the container model assigned the occupancy property "can be occupied only by a functional device" or "preferably occupied by a functional device";

a grid field of a module model assigned an operations room allocated to the respective process module should be arranged in a grid field of the container model assigned the occupancy property "can be occupied only by an operations room" or "preferably occupied by an operations room";

a grid field of a module model assigned a functional device of the respective process module should be arranged in a grid field of the container model which has already been occupied by a grid field of a further module model assigned a material output of the respective further process module; and a grid field of a module model assigned a material output of the respective process module should be arranged in a grid field of the container model which has already been occupied by a grid field of a further module model assigned a functional device of the respective further process module.

4. The computerized method according claim 1, wherein each grid field of the container model is assigned one of the properties "inside the container" or "outside the container".

5. The computerized method according to claim 1, wherein each grid field of the container model is assigned an absolute integer coordinate pair ($x_{abs}$, $y_{abs}$) wherein the origin of the underlying absolute coordinate system is arranged inside the base area of the process container.

6. The computerized method according to claim 5, wherein each module model is assigned an orientation relative to the absolute coordinate system.

7. The computerized method according to claim 1, wherein each grid field of a module model is assigned a relative integer coordinate pair ($x_{rel}$, $Y_{rel}$), wherein the origin of the underlying relative coordinate system is arranged inside the base area of the process module.

8. The computerized method according to claim 7, wherein each module model is assigned a position in the absolute coordinate system, which position is defined by the position of the origin of the respective relative coordinate system inside the absolute coordinate system.

9. The computerized method according to claim 1, wherein all possible connection variants between grid fields of different module models, which are each assigned a functional device, are determined, wherein each connection variant is weighted with a value from a predefinable range of values.

10. The computerized method according to claim 9, wherein connection variants weighted with a negative value result in the distance between grid fields associated with these connection variants being maximized, and in that connection variants weighted with a positive value result in the distance between grid fields associated with these connection variants being minimized.

11. The computerized method according to claim 9, wherein, in the case of a plurality of connection variants with comparable weightings with positive values, that connection variant which is weighted with the smallest positive value is selected.

12. The computerized method according to claim 9, wherein the predefinable range of values is from −100 to 100.

13. The computerized method according to claim 1, wherein the module models are arranged in the container model taking into account at least one of the further conditions selected from the following group:
    a grid field of a module model assigned a functional device of the respective process module must not occupy a grid field of the container model which has already been occupied by a grid field of a further module model assigned a functional device of the respective further process module;
    a grid field of a module model assigned an operations room allocated to the respective process module must not occupy a grid field of the container model which has already been occupied by a grid field of a further module model assigned a functional device of the respective further process module;
    a grid field of a module model assigned a functional device of the respective process module must not occupy a grid field of the container model assigned the occupancy property "cannot be occupied" or "can be occupied only by an operations room"; and
    a grid field of a module model assigned an operations room allocated to the respective process module must not occupy a grid field of the container model assigned the occupancy property "cannot be occupied" or "can be occupied only by a functional device".

14. The computerized method according to claim 1, wherein the module models (5) are arranged in the container model (2) taking into account at least one of the further conditions selected from the following group:
    the process modules should be able to be introduced into the process container via a longitudinal side of the latter;
    operations rooms and maintenance rooms for the process modules should be accessible after the process modules have been arranged as intended;
    the process modules should be able to be individually removed from the process container and installed in the latter without other process modules having to be removed for this purpose;
    process streams between process modules arranged as intended should not intersect third process modules.

15. The computerized method according to claim 1, wherein the module models are arranged in the container model assigned to the process container taking into account the arrangement of module models in a further container model assigned to a further process container, wherein the further process container is arranged above, below or beside the process container.

16. The computerized method according to claim 1, wherein a square standardized transport container, in particular according to DIN ISO 668, is used as the process container.

17. The computerized method according to claim 1, wherein the container model, the module models and the respective relative positions between the module models and the container model are displayed by a display device.

18. The computerized method according to claim 1, wherein the container model and the module models which are square.

* * * * *